(12) United States Patent
Santan

(10) Patent No.: US 8,751,210 B1
(45) Date of Patent: Jun. 10, 2014

(54) SUSPENDING PROCEDURES IN SIMULATION OF A CIRCUIT DESIGN

(75) Inventor: Sonal Santan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 416 days.

(21) Appl. No.: 12/619,623

(22) Filed: Nov. 16, 2009

(51) Int. Cl.
*G06F 17/50* (2006.01)
*G06G 7/62* (2006.01)
*G06F 9/455* (2006.01)
*G06F 9/45* (2006.01)

(52) U.S. Cl.
USPC ............... 703/14; 703/13; 716/106; 716/107; 717/140; 717/141; 717/159

(58) Field of Classification Search
USPC ............... 703/14, 13; 716/106, 107; 717/140, 717/141, 159
See application file for complete search history.

(56) References Cited

U.S. PATENT DOCUMENTS

2006/0206873 A1 * 9/2006 Argade ..................... 717/135

OTHER PUBLICATIONS

Berge, Jean-Michel et al. "VHDL Designer's Reference", 1992, Kluwer Academic Publishers, pp. (1, 2, 241).*
Eles, Petru et al., "Timing Constraint Specification and Synthesis in Behavioral VHDL", 1995, IEEE.*
Eles, Petru et al., "Synthesis of VHDL Concurrent Processes", 1994, ACM.*

* cited by examiner

*Primary Examiner* — Mary C Jacob
*Assistant Examiner* — Cedric D Johnson
(74) *Attorney, Agent, or Firm* — LeRoy D. Maunu

(57) ABSTRACT

When a wait statement is encountered in an HDL simulation, the simulation kernel executes functions corresponding to other processes while waiting for the wait to mature. However, the preservation of variables and states of each process and procedure in the call chain can be complex and inefficient. An embodiment of the present invention provides a method to suspend procedures in simulation of an HDL circuit design such that processes that call procedures containing wait statements are executed on a secondary runtime stack and can be suspended by saving the state of simulation and switching simulation execution to the primary runtime stack.

20 Claims, 5 Drawing Sheets

SUSPENDING PROCEDURES IN SIMULATION OF A CIRCUIT DESIGN

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

An embodiment of the present invention generally relates to the simulation of circuit designs.

BACKGROUND

Due to advancements in processing technology, complex integrated circuits (ICs) can be designed using various levels of abstraction. Using a hardware description language (HDL), circuits can be designed at the gate level, the register transfer level (RTL), and higher logical levels. When designing using an HDL, the design is often structured in a modular manner. The designer describes a module in terms of the behavior of a system describing signals that are generated and propagated through combinatorial modules from one set of registers to another set of registers. HDLs provide a rich set of constructs to describe the functionality of a module. Modules may be combined and augmented to form even higher level modules.

An HDL design can be synthesized to create a logical network list (netlist), which can be implemented within a particular programmable logic device. Prior to implementation, the HDL design can be simulated to determine whether the design will function as required. Wasted manufacturing costs due to faulty design may thereby be avoided. Numerous tools are available for simulating circuit designs including, for example, high-level modeling systems (HLMS) and hardware description language (HDL) simulators.

One popular HDL language to use for development is VHDL (VHSIC (Very High Speed Integrated Circuits) hardware description language). In a VHDL simulator, VHDL procedures containing wait statements pose a modeling challenge. Similar to a VHDL process statement, a procedure may get suspended at a wait statement contained in the procedure. However, unlike a process statement, a procedure cannot be statically elaborated. This poses various complexities in the implementation of VHDL procedures.

A VHDL simulator generally includes a VHDL language compiler and a simulation kernel. The compiler converts input VHDL files into code that is executable by a simulation kernel. In generating the executable code, the compiler maps VHDL constructs into the language constructs of a target language. The target language may be a general programming language such as C/assembly, or some other proprietary language. Every process statement in a VHDL design is compiled into a function in the target language. In addition, every VHDL procedure is also compiled into a unique function in the target language. When simulation begins, the simulation kernel reads in the executable code generated by the compiler and executes the code according to the VHDL language rules. In particular, a simulation kernel generally executes VHDL functions corresponding to processes in a loop. Like an operating system kernel, functions corresponding to active processes are scheduled according to a scheduling algorithm, such as round robin, and executed by the kernel for a specific period of time. After a function has been executed the kernel executes the other functions. When all processes have been executed, the kernel executes the functions again as scheduled. In this manner functions corresponding to processes are simulated in a loop.

When the compiled function for a process, say p0, encounters a wait statement, the simulation kernel, executes functions corresponding to other processes while waiting for p0's wait to mature. Enabling a return to the simulation kernel during a wait is performed by recording the code location to which the process needs to resume after the wait statement has expired. The VHDL objects, upon which the process operates, are statically elaborated and persist in a global memory space throughout the simulation run. Simple C labels can be used to model resumption points in p0. When a wait statement is encountered a label is created at the location of the next statement to be executed after the wait. When the compiled function corresponding to p0 is called, the function will resume at the statement following the wait by jumping to the label using a goto statement.

If the process calls a VHDL procedure which does not have a wait statement, the compiled function of the procedure in the target language is simply invoked from within the compiled function of the process. Resumption points do not need to be recorded or used. Example 1 below shows a VHDL code sample of a process and two procedures that do not contain wait statements.

```
procedure foo2 (variable aa: integer; variable bb: out integer) is variable vv: integer:=aa*2;
  begin
    bb:=vv;
  end procedure;
procedure foo1 (variable aa1, aa2: in integer; variable
    bb: out integer) is
    variable vv1: integer;
    variable vv2: integer;
  begin
    vv1:=aa1+aa2;
    foo2(vv1, vv2);
    bb:=vv2/vv1;
  end procedure;
p0: process
  variable v1, v2, v3: integer;
begin
  v1:=10;
  v2:=20;
  wait for 5 ns;
  foo1 (v1, v2, v3);
  wait;
end process
```

EXAMPLE 1

In Example 1, a process p0 calls a procedure foo1 which in turn calls another procedure foo2, building up a chain of function calls. In example 1, the chain of calls would be p0( )→foo1( )→foo2( ). However, the control always returns back to p0, since there is no wait statement inside either foo1 or foo2. When a procedure such as foo1 or foo2 is called, the declarations inside the respective procedure (such as vv1, vv2 and vv) are elaborated and created on a call memory stack for the duration of the call. When the subprogram foo1 or foo2 finishes execution and returns, the declarations which were created on the call memory stack are destroyed.

A different situation is presented when the called VHDL procedure contains a wait statement(s). Example 2 below shows a VHDL code sample of a process and two procedures, one with a wait statement and one without.

```
procedure bar2 (variable aa: integer; variable bb: out integer) is variable vv: integer:=aa*2;
  begin
    wait for 5 ns;
    bb:=vv;
  end procedure;
procedure bar1 (variable aa1, aa2: in integer; variable
    bb: out integer) is
    variable vv1: integer;
    variable vv2: integer;
  begin
    vv1:=aa1+aa2;
    bar2(vv1, vv2);
    bb:=vv2/vv1;
  end procedure;
p1: process
    variable v1, v2, v3: integer;
  begin
    v1:=10;
    v2:=20;
    wait for 5 ns;
    bar1(v1, v2, v3);
    wait;
  end process;
```

EXAMPLE 2

In Example 2, process p1 calls procedure bad which calls procedure bar2 which contains a wait statement. When the wait statement is encountered in executing bar2, bar2 needs to return execution control back to bar1. However, the declarations inside bar2, particularly the declaration of vv, need to be preserved. Otherwise, the data values would be lost. Also the code location at which execution is to resume needs to be recorded. When the call to bar2 returns, bar1 needs to determine if bar2 has run to completion, or if bar2 was suspended. Accordingly, bar1 has to either return to its caller, p1, or continue with the next statement of bar1, which is bb:=vv2/vv1. If bad needs to return to its caller p1 because bar2 got suspended by a wait statement, then bar1 needs to record its own resumption point. The resumption point in this case is the same as calling bar2 again to recreate the call chain. In addition, p1 also needs to know if bar1 is returning because bar2 ran to completion or if bar2 (or a procedure called by bar2) was suspended. In the case of bar2 having run to completion, p1 can continue with the next statement in p1. In the case where bar2 was suspended, p1 should return back to the kernel and wait for its (or one of its callee procedures such as bar1 or bar2) wait statement to expire.

All these details require a lot of bookkeeping code which affects speed of simulation. The bookkeeping code may be generated by the compiler which increases the complexity of the compiler itself. In addition, the declarations inside a procedure need to be preserved when that procedure is suspended due to a wait statement.

The creation of the bookkeeping code inside each compiled function presents several challenges. The VHDL object and VHDL type/subtype declarations inside VHDL procedures need to be elaborated (and hence created) dynamically at the time of invocation of the procedure. Additionally, the VHDL procedure would need to implement its own state machine for the wait statements contained in the procedure. Further, if a called procedure needs to suspend because of a wait statement, the declarations inside the procedure need to be backed up since a return to the calling process (or procedure if this procedure was called from another procedure) would clear the runtime memory stack on which the procedure was executing.

One solution is to re-elaborate the local declarations inside the procedure at the time the procedure is resumed after the wait statement expires. This requires identifying when a call to the procedure is a first time call versus when a call is a continuation of an earlier call which was suspended due to a wait statement.

Another solution is to elaborate and create the local declarations inside a procedure with wait statements on a memory heap. However the memory heap would require additional memory management code as well. In addition, code to access the local declarations will be different for procedures with wait statements versus procedures without wait statements.

Another challenge presented is that the calling VHDL process, including all procedures which call another procedure with a wait statement, need special bookkeeping code to handle calling of procedures with wait statements. This includes early return by a called procedure when the called procedure returns because of wait statement and restarting the call again later when the wait is over.

The compiler's code generator needs to treat statements inside a procedure with wait statements(s) differently from similar statements inside procedures without a wait statement, since the former requires creation of a state machine. In addition, accessing the local declarations in the procedures may require different code.

These solutions involve extra simulation runtime cost in resuming a previously suspended procedure since the resumption involves calling the process again which needs to call the procedure again to recreate the call chain. This is required because common programming languages such as C/C++ do not provide a way to save the stack of a called function and then use it to resume the function from where it left it last.

One or more embodiments of the present invention may address one or more of the above issues.

SUMMARY

In one embodiment of the present invention, a method is provided for simulating a circuit design. A specification of the circuit design is loaded into a first memory buffer. The circuit design specification is simulated in the first memory buffer. When a process that contains a call to a procedure containing a wait statement is called: a first state, corresponding to the current state of simulation, is saved; the process and the procedure are loaded into a second memory buffer; and the current state of simulation is set to a state for continuing simulating with the process and procedure specification in the second memory buffer. In response to a wait statement encountered during simulation of the process and procedure in the second memory buffer: a second state, corresponding to the current state of simulation, is saved; and the current state of simulation is set to that of the first state for continuing simulating of the specification in the first memory buffer.

In another embodiment of the present invention, a method is provided for the compilation of an HDL specification for simulation. A second intermediate process, corresponding to a first process of the specification that contains a call to a procedure containing a wait statement, is created. Calls to the first process in the HDL specification are replaced with calls to the second intermediate process and the second intermediate process is appended to the modified HDL specification. The appended HDL specification is compiled into a form executable on a simulator and stored. The executable specification is compiled such that it loads a first memory buffer when executed.

The second intermediate process, when executed, loads the first process and the procedure into a second memory buffer. A first state, corresponding to the current CPU state, is saved and the current CPU state is set to a state to execute the process and procedure in the second memory buffer. When a wait statement is encountered during execution of the process and procedure loaded in the procedure memory buffer, a second state corresponding to the current CPU state is saved and the current CPU state is set to that of the first state to continue execution of the executable specification in the first memory buffer.

In yet another embodiment, a system is provided for simulating a circuit design specification. The system includes a processor, a common bus coupled to the processor, a memory unit coupled to the common bus, and an input/output unit coupled to a common bus. The processor and memory are configured to implement a first and a second memory stack in the memory unit. The process and memory are further configured to load a specification of the circuit design into the first memory stack and simulate the first specification on the first memory stack. In response to a call during simulation to a process contained in the specification which calls a procedure containing a wait statement, the processor and memory are further configured to load a the process and the procedure into the second memory stack, determine and store a first state corresponding to the current state of the system; and set the current state of the system to a state for simulation of the process and procedure on the second memory stack. In response to a wait statement encountered during simulation of the process and procedure specification, the processor and memory are further configured to save a second state corresponding to the current state of the system and set the state of the system to that of the first state to continue simulation of the specification on the first memory stack.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION OF THE DRAWINGS

One or more embodiments of the present invention provides a method to suspend procedures in simulation of an HDL circuit design such that procedures containing wait statements are executed on a secondary runtime stack and can be suspended by saving the state of simulation and switching simulation execution to the primary runtime stack. The simulation kernel runs on the primary runtime stack. As processes are called by the kernel they are loaded and executed on the primary runtime stack. When the simulation kernel executes a process, such as p1 in Example 2, that calls a procedure containing a wait statement, the simulator switches to simulate on a secondary runtime stack.

The switch of the simulation to a different stack is referred to as a context switch. When a context switch is performed, the current state of simulation is saved and is then set to continue execution at the desired location or state. The state of simulation is also referred to as the simulation state, the CPU state, or the CPU context and such terms are used interchangeably herein. A runtime stack is also referred to as a memory buffer and such terms are used interchangeably herein.

Before the switch to the secondary runtime stack is performed, the current CPU context of the primary stack (kernel context) is saved to memory, and the process and procedure are loaded into the secondary runtime stack. When the wait statement is encountered, the CPU context corresponding to simulation of the process and the procedure (procedure context) is saved, the contents of the secondary stack pertaining to the process and procedure are stored in memory, and the current context is set to the previously saved kernel context state. Switching to the previously saved kernel context triggers the simulation to execute the kernel loaded on the primary runtime stack.

When the appropriate amount of time has passed and the wait statement has expired, the kernel context is saved, the saved process and procedure are reloaded onto the secondary stack, and the CPU context is set to the previously saved procedure context. The simulation switches execution to the secondary runtime stack and resumes simulation of the procedure.

When the process and procedure complete, the process and procedure are removed from the secondary stack and the CPU context is set to the most recent kernel context.

Figure 1:
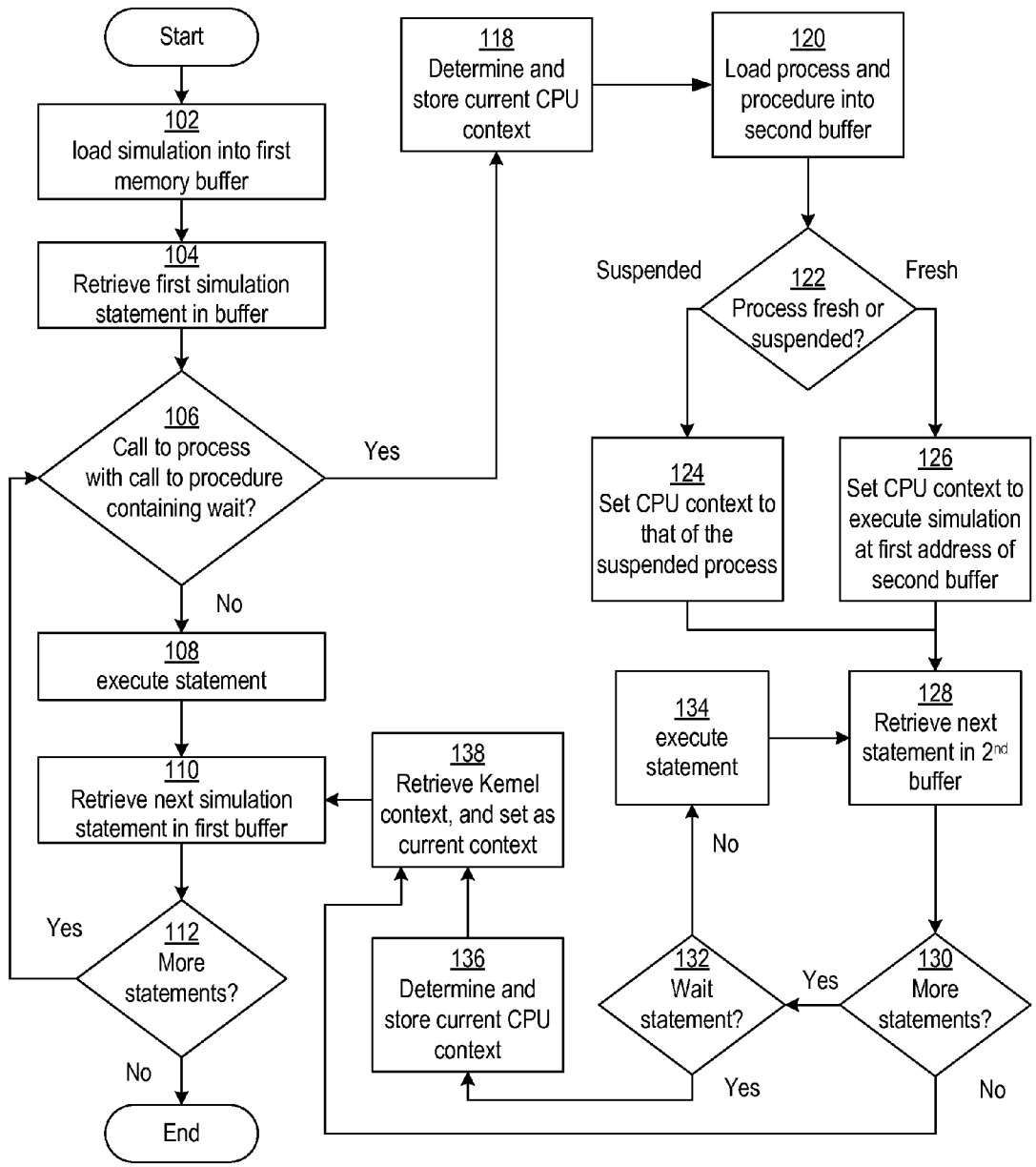
FIG. 1 illustrates a flowchart of a process of simulating a circuit design in accordance with an embodiment of the invention.

FIG. 1 shows a flowchart of a process of simulating a circuit design in accordance with an embodiment of the invention. A circuit design simulation is loaded into the first memory buffer at step 102. The process repeatedly fetches and executes statements in the simulation at steps 104 and 108 until a call to a process containing a wait statement is encountered at decision step 106. The current context of the simulation kernel is stored at 118. The process and procedure are loaded into a second buffer at step 120. If the process has not yet been called and suspended, a context switch is performed to start execution at the beginning of the second memory buffer at step 126. If the process had been suspended, the context is set to that of the suspended process at step 124. The statements of the process and procedure in the second buffer are retrieved and executed at steps 128 and 134 until completed or a wait statement is encountered at decision steps 130 or 132. The current context of the CPU is stored at step 136, and a context switch to the kernel is performed at step 138. When the wait statement expires, a statement in the simulation kernel calls the process which triggers the context switch to the suspended process and procedure at decision step 106. The simulation will continue simulation of the first and second memory buffers until simulation completes at decision step 112.

The method of simulation can be implemented by a simulator configured to control the context state and maintain operation of the first and second memory buffers. Alternatively, the HDL design can be compiled to add executable code to the process and procedure to control the context state and maintain operation of the first and second memory buffers. In either implementation, a stub is created for each process that calls a procedure containing a wait statement. During simulation, the kernel calls the stub which then performs the context switches and performs the call to the actual process.

A ContextContainer data structure is created to store data needed by the stub code. The ContextContainer data structure is configured to store the contents of the secondary stack (stackCopy) and the context of the secondary runtime stack (subprogramCPUContext). The context of the primary runtime stack (kernelCPUContext) and the state of the process and procedure (suspendState) are also stored in the ContextContainer.

Figure 2:
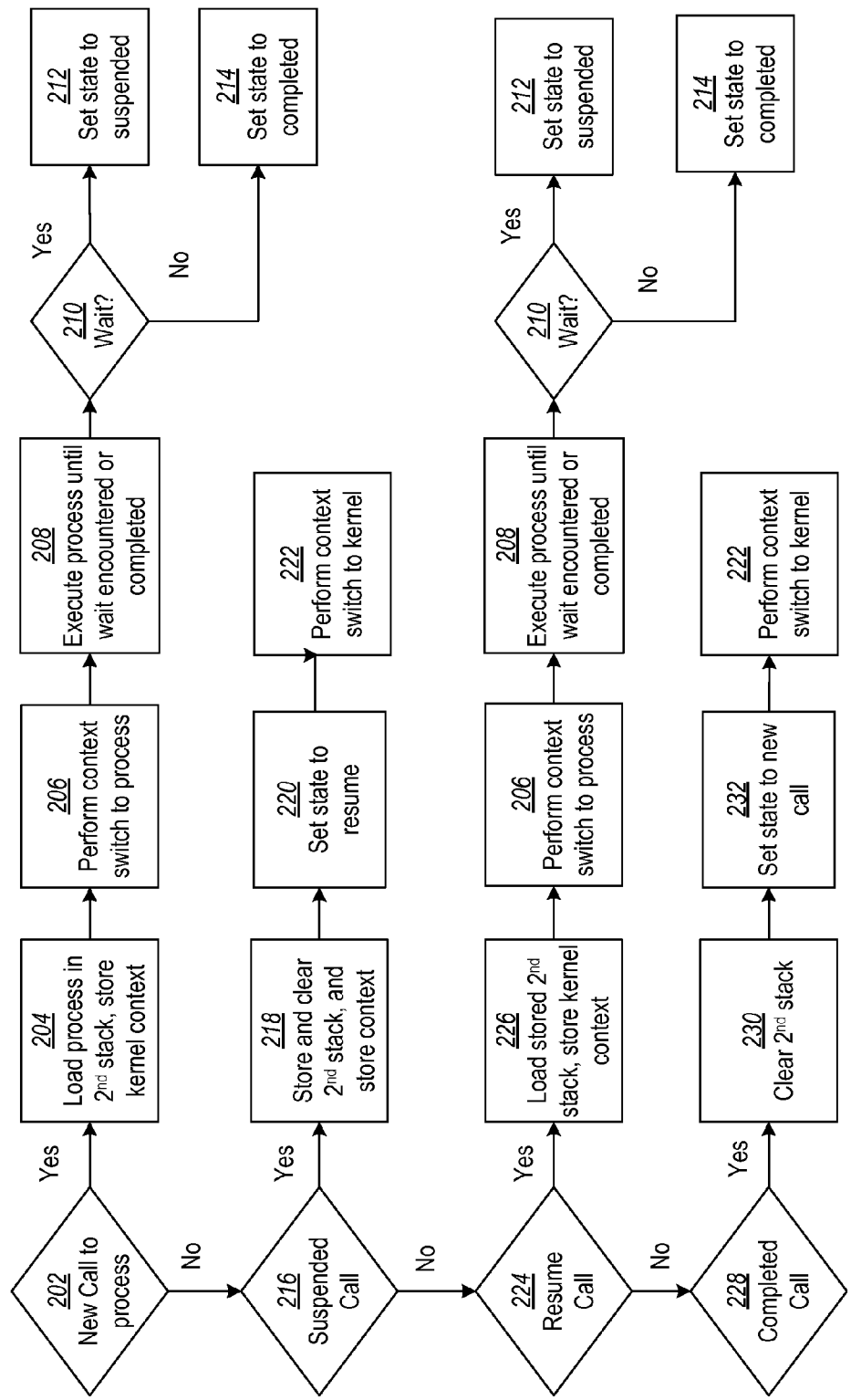
FIG. 2 illustrates a flowchart of a state machine context controller utilizing states to track the status of the process in accordance with an embodiment of the invention.

There are four states in which the process and procedure may exist: a new call to the process, a suspended call, a resumed call, and completed. The stub acts as a controller to set the context states and to load the secondary buffer when called or when the procedure encounters a wait. FIG. 2 shows a flowchart of a state machine context controller utilizing states to track the status of the process in accordance with an embodiment of the invention. When the controller stub is called by the kernel, the controller stub checks to determine its current state (202, 216, 224, and 228). If the state is a new call to the process at decision step 202, the process and procedure are loaded into the secondary stack and the kernel context is stored at step 204. The context switch to execute the process is performed at step 206. The process and procedure are executed at step 208 until completed or a wait statement is encountered at step 210. If completed, the stub controller sets the state to completed at step 214. If a wait statement is encountered, the stub controller sets the state to suspended at step 212.

If the state is a suspended call at decision step 216, the context of the process and the secondary stack contents are stored at step 218. The state is set to resume at step 220. The context is then switched back to the kernel at step 222. If the state is a resume call to the process at decision step 224, the stored process and procedure are loaded into the secondary stack and the kernel context is stored at step 226. The context switch to execute the process is performed at step 206. The process and procedure are executed at step 208 until completed or a wait statement is encountered. If completed, the stub controller sets the state to completed at step 214. If wait statement is encountered, the stub controller sets the state to suspended at step 212. If the state is completed at decision step 216, the secondary stack is cleared at step 230. The state is set to new call at step 232 and the context is then switched back to the kernel at step 222.

Figure 3:
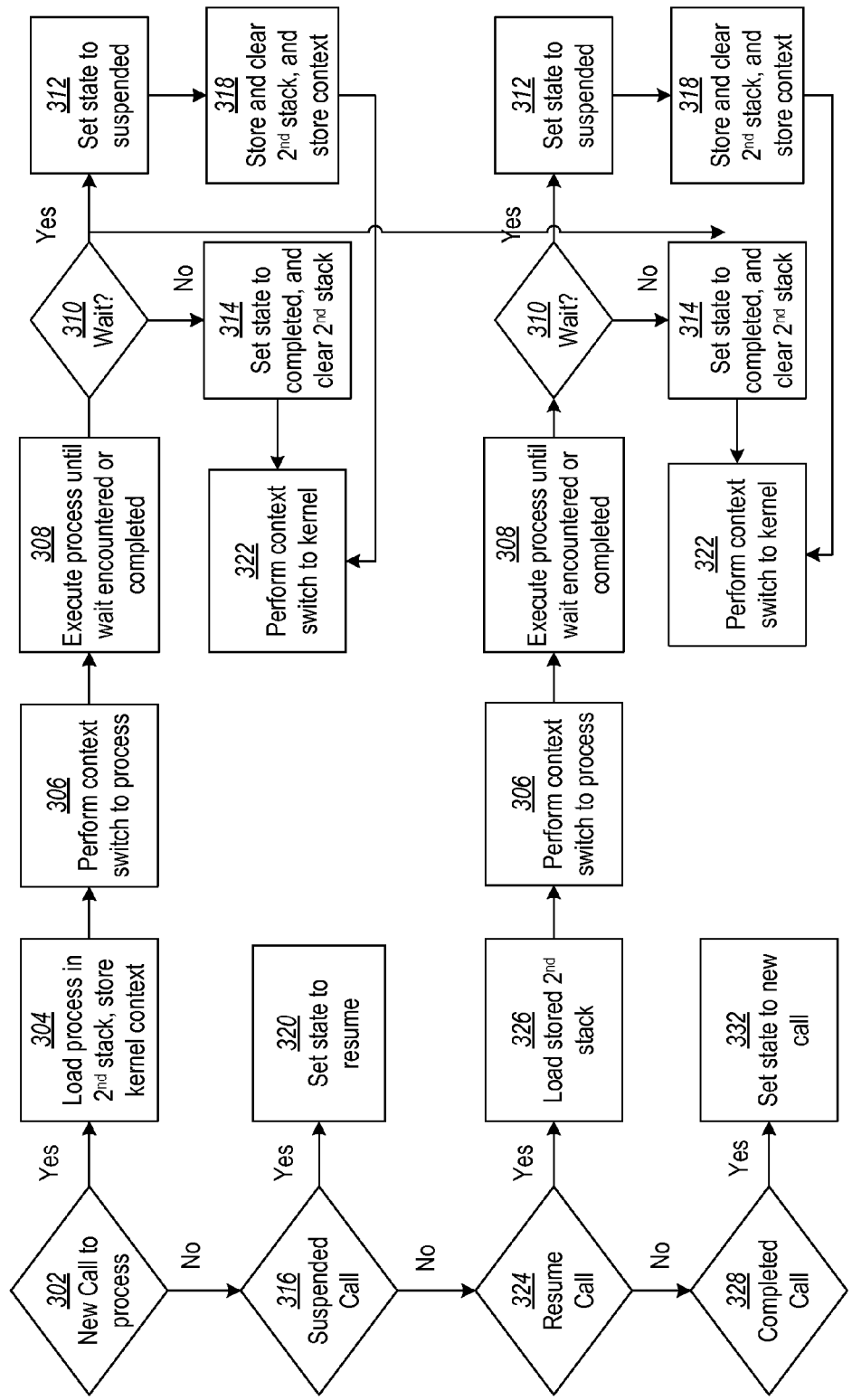
FIG. 3 illustrates a flowchart of another state machine context controller utilizing states to track the status of the process in accordance with another embodiment of the invention.

FIG. 3 shows a flowchart diagram of another implementation of a state machine context controller utilizing states to track the status of the process in accordance with an embodiment of the invention. When the controller stub is called by the kernel, the controller stub checks to determine its current state (302, 316, 324, and 328).

If the state is a new call to the process at decision step 302, the process and procedure are loaded into the secondary stack and the kernel context is stored at step 304. The context switch to execute the process is performed at step 306. The process and procedure are executed at step 308 until completed or a wait statement is encountered at step 310. If completed, the stub controller sets the state to completed and clears the secondary stack at step 314. If a wait statement is encountered, the stub controller sets the state to suspended at step 312. The context is stored and the contents of the secondary stack are stored and cleared from the stack at step 318. The context switch to the kernel is performed at step 322.

If the state is a suspended call at decision step 316, the state is set to resume at step 320. If the state is a resume call to the process at decision step 324, the stored process and procedure are loaded into the secondary stack and the kernel context is stored at step 326. The context switch to execute the process is performed at step 306. The process and procedure are executed at step 308 until completed or a wait statement is encountered. If completed, the stub controller sets the state to completed and clears the secondary stack at step 314. If wait statement is encountered, the stub controller sets the state to suspended at step 312. If the state is completed at decision step at 328, then the state is set to new call at step 332.

Figure 4:
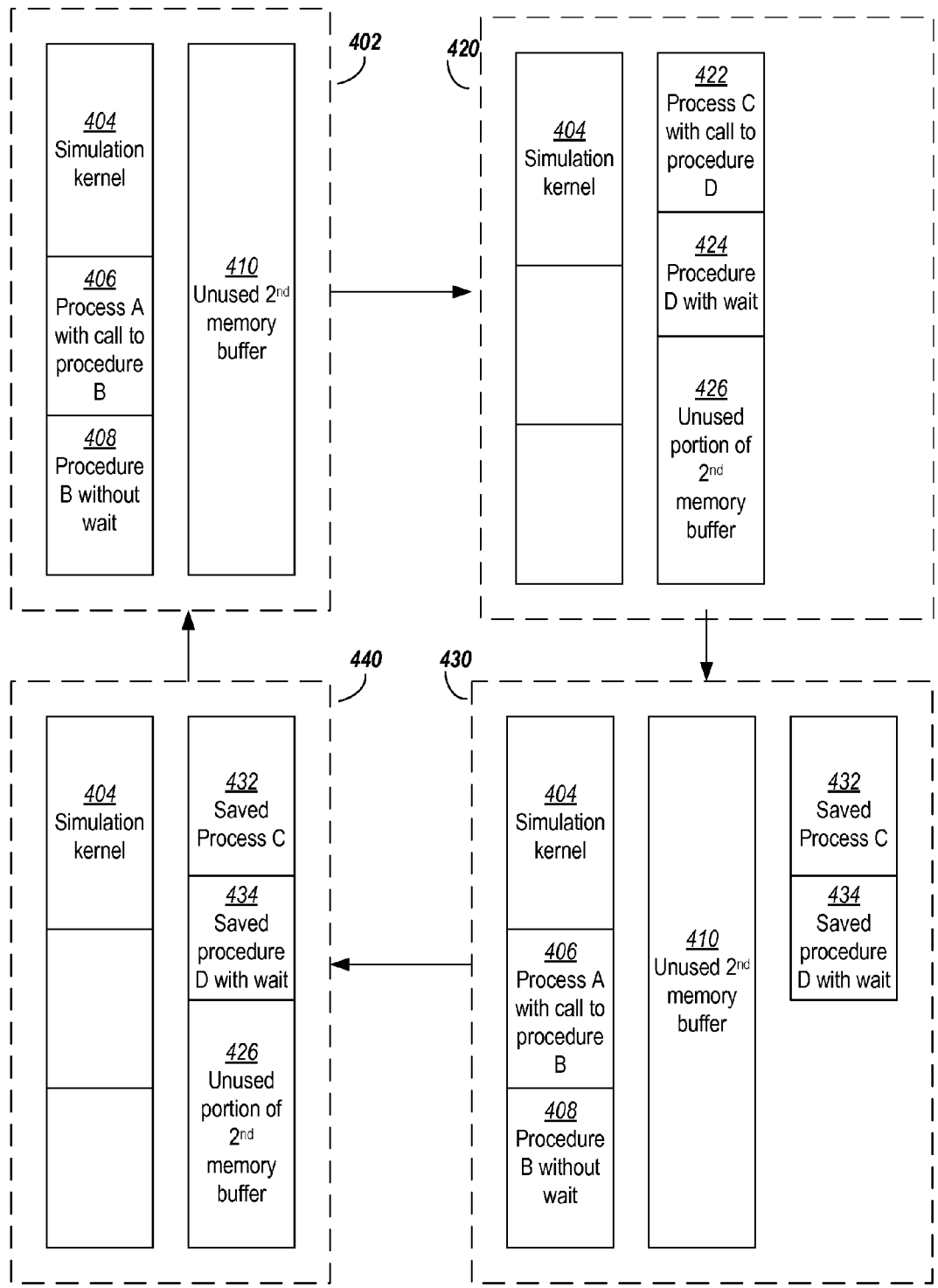
FIG. 4 illustrates, as an example, the contents of the first and second memory buffers as context is switched during simulation.

FIG. 4 shows the contents of the first and second memory buffers during simulation of a design with 2 processes (A and C) and 2 procedures (B and D). Process A (block 406) calls procedure B (block 408) which does not contain a wait statement and process C (block 422) calls procedure D (block 424) which does contain a wait statement. Block 402 shows the first buffer and second buffer 410 prior to the context switch. Process A and procedure B are loaded in the first buffer with the kernel 404 because procedure B does not contain a wait statement.

When the kernel stops executing process A and procedure B, they are removed from the first buffer. When a call to process C is reached, process C and procedure D are loaded on the second buffer, a context switch is performed, and the buffers become as shown in 420. The process and procedure in the second buffer are then simulated.

When a wait occurs, the context is set back to the kernel as shown at 430. At this point, process C and procedure D, as modified during simulation, are stored in memory at 432 and 434 respectfully. Process A and procedure B are loaded back into the first buffer for continued simulation as shown in 430.

When the wait expires, the saved process C 432 and procedure D 434 are loaded back into the second memory buffer and simulated once the context switches to the second memory buffer. When simulation of process C and procedure D completes, the context switches back to the kernel as shown in 402.

The actions performed in each of the states discussed in FIGS. 2 and 3 are controlled by a stub created for the process and procedure. Example 3, below, shows high level pseudo code of executeStub( ). The executeStub( ) function receives the ContextContainer object associated with that process. The state variable suspendState is used to track the state of execution of the process. The executeStub( ) acts as a common gateway to the real executable functions corresponding to processes that call procedures containing wait statements.

```
void executeStub(container) {
    container.kernelCPUcontext=getcontext( )
    // a future call to setcontext with kernelCPUcontext
    // will restart the control flow from the next
    // statement below
    if (container.suspendState==NEW_CALL) {
        // new call
        switch2subprogramStack(container, NEW_CALL);
    }
    else                                              if
        (container.suspendState==SUSPENDED_CALL) {
        // just got suspended, return and set the
        // future state to resume
        container.suspendState=RESUME_CALL;
    }
    else if (container.suspendState==RESUME_CALL) {
        // resume a previously suspended call
```

```
        // restore the stack and jump to the previous // location
            switch2subprogramStack(container,    RESUME-
               _CALL);
    }
    else {
        // just returned (ran to completion) a procedure
        // with wait
        assert(container.suspendState==DONE_CALL);
        // future call will be a fresh call
        container.suspendState=NEW_CALL;
    }
}
```

EXAMPLE 3

A helper routine switch2subprogramStack( ) adjusts the simulation flow to differentiate between a newcall to a process with wait statements versus the resumption of a previously suspended process. Example 4 below shows high level pseudo code of switch2subprogramStack( ). In the case of the new call, switch2subprogramStack( ) sets up the new registers and switches the stack to the secondary runtime stack. The switch2subprogramStack( ) then calls the compiled real execute function for the process. In case of a resumed call because a wait expired, switch2subprogramStack( ) relies on another helper routine, restoreStackAndResume( ) to configure the secondary stack and perform the context switch.

```
void switch2subprogramStack(container, mode)
{
    if (mode==NEW_CALL) {
        EBP=SubprogramStack;
        ESP=SubprogramStack;
        // Call the real execute function for this process con-
            tainer.execute( )
        // If we reach here then the call finished
            container.suspendState==DONE_CALL;
        // jump back to kernel with the updated //suspendState
            setcontext(container.kernelCPUcontext);
    }
    else {
        assert(mode==RESUME_CALL);
        restoreStackAndResume(container);
    }
}
```

EXAMPLE 4

A restoreStackAndResume( ) routine copies the previously backed up stack (stackCopy) to the exact same location in the secondary runtime stack as as it was previously when it was backed up. The restoreStackAndResume( ) routine subsequently sets the context to the subprogramCPUContext( ) via call to setcontext( ), which causes the procedure to resume from where it was suspended in the previous call. Example 5 below shows high level pseudo code of restoreStackAndResume( ).

```
void restoreStackAndResume(container)
{
    // overlay the previous stack on the secondary buffer
    memcpy(subprogramCPUcontext.ESP, container.stack-
        Copy, container.stackSize);
    // Resume from where we left last time in subprogram
    setcontext(container.subprogramCPUcontext);
}
```

EXAMPLE 5

When a procedure needs to suspend, it calls the routine saveStackAndSuspend( ). This captures the current subprogram context into subprogramCPUContext via call to getcontext( ). It then backs up the runtime stack into the stackCopy back buffer. Subsequently it switches the context back to the simulation kernel via call to setcontext( ) with kernelCPUContext. Example 6 below shows high level pseudo code of saveStackAndSuspend( ).

```
void saveStackAndSuspend(container)
{
    container.subprogramCPUcontext=getcontext( )
    if (container.suspendState==SUSPENDED_CALL) {
        memcpy(suspendState.stackCopy, container
            .subprogramCPUcontext.ESP, container.stackSize);
        setcontext(container.kernelCPUcontext);
    }
}
```

EXAMPLE 6

Figure 5:
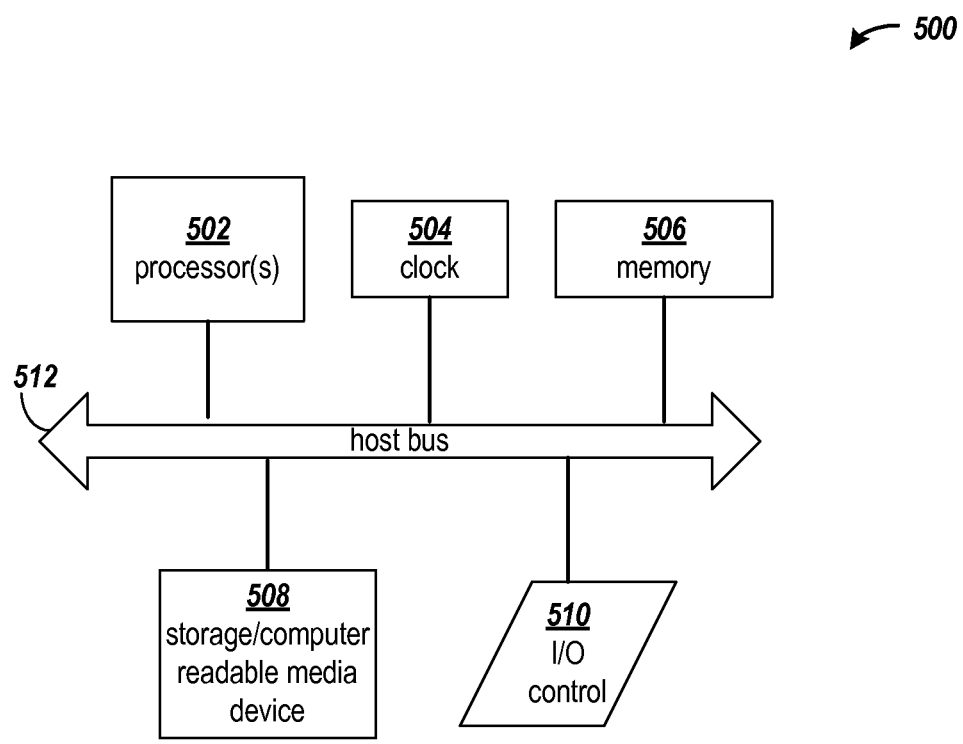
FIG. 5 illustrates a block diagram of a computing arrangement on which the processes described herein may be implemented.

FIG. 5 is a block diagram of an example computing arrangement on which the processes described herein may be implemented. Those skilled in the art will appreciate that various alternative computing arrangements, including one or more processors and a memory arrangement configured with program code, would be suitable for hosting the processes and data structures and implementing the algorithms of the different embodiments of the present invention. The computer code, comprising the processes of the present invention encoded in a processor executable format, may be stored and provided via a variety of computer-readable storage media or delivery channels such as magnetic or optical disks or tapes, electronic storage devices, or as application services over a network.

Processor computing arrangement 500 includes one or more processors 502, a clock signal generator 504, a memory 506, a storage/computer readable media device ("storage device") 508, and an input/output control unit 510 coupled to host bus 512. The arrangement 500 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 502 may be one or more general purpose processors, or a combination of one or more general purpose processors and suitable co-processors, or one or more specialized processors (e.g., RISC, CISC, pipelined, etc.).

The memory 506 typically includes multiple levels of cache memory, and a main memory. The storage device 508 may include local and/or remote persistent storage such as provided by magnetic disks (not shown), flash, EPROM, or other non-volatile data storage. The storage unit may be read or read/write capable. Further, the memory 506 and storage device 508 may be combined in a single arrangement.

The processor 502 executes the software in storage device 508 and/or memory 506, reads data from and stores data to the storage device 508 and/or memory 506, and communicates with external devices through the input/output control 510. These functions are synchronized by the clock signal generator 504. The resource of the computing arrangement may be managed by either an operating system (not shown), or a hardware control unit (not shown).

One or more embodiments of the present invention is thought to be applicable to a variety of systems for a data bus controller. Other aspects and embodiments of the present invention will be apparent to those skilled in the art from consideration of the specification and practice of the invention disclosed herein. It is intended that the specification and illustrated embodiments herein be considered as examples only, with a true scope and spirit of the invention being indicated by the following claims.

What is claimed is:

1. A method of simulating a circuit design comprising:
   loading a specification of the circuit design into a first runtime stack;
   simulating the circuit design specification on a simulator in the first runtime stack;
   in response to each call during simulation to each first process contained in the specification and having no call to a procedure that contains a wait statement:
      loading the first process into the first runtime stack; and
      executing statements of the first process;
   in response to a call during simulation to a second process contained in the specification and having a call to a procedure containing a wait statement:
      saving a first state corresponding to the current state of simulation;
      loading the second process into a second runtime stack; and
      setting the current state of simulation to a state for continuing simulating with the second process in the second runtime stack; and
   in response to a wait statement encountered in the procedure called by the second process during simulation of the second process in the second runtime stack:
      saving a second state corresponding to the current state of simulation; and
      setting the current state of simulation to the first state for continuing simulating of the specification in the first runtime stack;
   in response to the simulator determining the wait statement has expired, performing the steps of:
      saving a third state corresponding to the current state of the simulation; and
      setting the current state of the simulation to the second state for continuing simulating of the second process in the second runtime stack;
   in response to completing the simulation of the second process in the second runtime stack, setting the current state of the simulation to the third state for continuing simulating of the specification in the first runtime stack.

2. The method of claim 1, further comprising:
   saving contents of the second runtime stack, corresponding to the second process, in a segment of memory in response to the wait statement encountered during simulation of the second process and the procedure called by the second process in the second runtime stack; and
   loading the saved contents, corresponding to the second process and the procedure called by the second process, in to the second runtime stack in response to the simulator determining the wait statement has expired.

3. The method of claim 2, further comprising clearing the second runtime stack in response to saving the contents of the second runtime stack corresponding to the second process and the procedure called by the second process.

4. The method of claim 2, further comprising clearing the second runtime stack in response to completing the simulation of the second process and the procedure called by the second process in the second runtime stack.

5. The method of claim 2, further comprising creating and configuring a data structure to store the first, second, and third states.

6. The method of claim 5, wherein the data structure is further configured to store a state indicating whether the second process has been newly called, suspended, resumed, or completed.

7. The method of claim 1, wherein the circuit design specification is in a language format that does not have fork-join capability.

8. The method of claim 1, wherein the circuit design specification is in VHDL format.

9. A method to compile an HDL specification for simulation comprising:
   creating a second intermediate process corresponding to a first process of the specification that contains a call to a procedure containing a wait statement;
   replacing calls to the first process in the HDL specification with calls to the second intermediate process;
   appending the second intermediate process to the modified HDL specification;
   compiling the appended HDL specification into a form executable on a simulator;
   storing the compiled executable form;
   wherein the executable specification loads a first runtime stack when executed; and
   wherein the second intermediate process comprises:
      loading the first process and the procedure into a second runtime stack;
      saving a first state corresponding to the current CPU state;
      setting the current CPU state to a state to execute the first process and procedure in the second runtime stack; and
      in response to a wait statement encountered during execution of the first process and procedure loaded in the second runtime stack, performing the steps of:
      saving a second state corresponding to the current CPU state; and
      setting the current CPU state to that of the first state to continue
      execution of the executable specification in the first runtime stack.

10. The method of claim 9, wherein the second intermediate process comprises:
    in response to the simulator determining the wait statement has expired, performing the steps of:
       saving a third state corresponding to the current CPU state; and
       setting the state of the simulation to that of the second state to continue execution of the first process and procedure in the second runtime stack;
    in response to completing execution of the first process, setting the state of the simulation to that of the third state to continue execution of the executable specification in the first runtime stack;
    saving the contents of the second runtime stack, corresponding to the first process and procedure, in a segment of memory in response to a wait statement encountered execution of the first process and procedure; and
    loading the saved contents, corresponding to the first process and procedure, into the second runtime stack in response to the simulator determining the wait statement has expired.

11. The method of claim 10, wherein the second intermediate process further comprises clearing the second runtime stack in response to saving the contents of the second runtime stack corresponding to the first process and procedure.

12. The method of claim 10, wherein the second intermediate process further comprises clearing the second runtime stack in response to completing the execution of the first process and procedure in the second runtime stack.

13. The method of claim 10, wherein the second intermediate process further comprises creating and configuring a data structure to store the first, second, and third states.

14. The method of claim 13, wherein the data structure is further configured to store a state indicating whether the first process has been newly called, suspended, resumed, or completed.

15. A system for simulating a circuit design specification comprising:
   a processor;
   a common bus coupled to the processor;
   a memory unit coupled to the common bus; and
   an input/output unit coupled to a common bus;
   wherein, the processor and memory are configured to:
      implement a first and second memory stack in the memory unit;
      load a specification of the circuit design into the first memory stack;
      in response to each call during simulation of the specification to each first process contained in the specification and having no call to a procedure that contains a wait statement, simulate the first process on the first memory stack;
   wherein, in response to a call during simulation to a second process contained in the specification and calls a procedure containing a wait statement, the processor and memory are further configured to:
      load the second process into the second memory stack;
      determine and store a first state corresponding to the current state of the system; and
      set the current state of the system to a state for simulation of the second process on the second memory stack; and
   wherein, in response to a wait statement encountered in the procedure called by the second process during simulation of the second process, the processor and memory are further configured to:
      save a second state corresponding to the current state of the system; and
      set the context state of the system to that of the first context state to continue simulation of the specification on the first memory stack;
   in response to an expiration of the wait statement;
      save a third state corresponding to the current state of the system; and
      set the current state of the system to that of the second state to continue simulation of the second process and the procedure called by the second process on the second memory stack;
   in response to completing the simulation of the second process, set the current state of the simulation to that of the third state to continue simulation of the specification on the first memory stack.

16. The system of claim 15, wherein the processor and memory are further configured to:
   save the contents of the second memory stack, corresponding to the second process, in a segment of memory in response to a wait statement encountered during simulation of the second process and the procedure called by the second process in the second memory stack; and
   load the saved contents, corresponding to the second process and the procedure called by the second process, into the second memory stack in response to the simulator determining the wait statement has expired.

17. The system of claim 16, wherein the processor and memory are further configured to clear the second memory stack in response to saving the contents of the second memory stack corresponding to the second process and the procedure called by the second process.

18. The system of claim 16, wherein the processor and memory are further configured to clear the second memory stack in response to completing the simulation of the second process and the procedure called by the second process.

19. The system of claim 16, wherein the processor and memory are further configured to: create and configure a data structure to store the first, second, and third buffer contexts.

20. The system of claim 19, wherein the processor and memory are further configured to store a state in the data structure indicating whether the second process has been newly called, suspended, resumed, or completed.

* * * * *